United States Patent [19]

Inasaka

[11] Patent Number: 5,792,293

[45] Date of Patent: Aug. 11, 1998

[54] METHOD OF FABRICATING A MULTI-LAYER WIRING SUBSTRATE

[75] Inventor: Jun Inasaka, Tokyo, Japan

[73] Assignee: NEC Corporation, Tokyo, Japan

[21] Appl. No.: 366,602

[22] Filed: Dec. 29, 1994

[30] Foreign Application Priority Data

Dec. 29, 1993 [JP] Japan ................................. 5-352380

[51] Int. Cl.[6] ........................... B32B 31/26; C04B 35/64
[52] U.S. Cl. ........................... 156/89.16; 156/89.12; 156/246; 156/249; 156/252; 156/267; 29/851
[58] Field of Search ........................... 156/89, 231, 235, 156/249, 252, 253, 89.12, 89.16, 246, 267; 264/61, 614, 619; 29/851

[56] References Cited

U.S. PATENT DOCUMENTS

| | | | |
|---|---|---|---|
| 5,271,150 | 12/1993 | Inasaka | 156/89 X |
| 5,274,916 | 1/1994 | Kawabata et al. | |
| 5,300,163 | 4/1994 | Ohtaki | 156/89 |
| 5,316,602 | 5/1994 | Kogame et al. | 156/89 X |
| 5,480,503 | 1/1996 | Casey et al. | 156/89 |

OTHER PUBLICATIONS

"High-Speed Computer Packaging with Multilayer Glass Ceramic Substrate"; Yuzo Shimada et al.; NEC Research and Development, vol. 34, No. 3, Jul. 1993; pp. 303–313.

*Primary Examiner*—Curtis Mayes
*Attorney, Agent, or Firm*—Whitham, Curtis & Whitham

[57] ABSTRACT

A method of fabricating a ceramic multi-layered wiring substrate, in which deformation of ceramic green sheets is prevented so that the probability of connection failure of through-holes is reduced, includes forming a ceramic green sheet on a carrier film and forming through-holes through the ceramic green sheet and the carrier film. The carrier film is used as a mask when the through-holes are filled with electrically conductive paste. The green sheet is attached onto a thick plate. The green sheets attached on the respective thick plates are sequentially adhered and laminated temporarily. The laminated green sheets form a ceramic green sheet lamination block which is sintered, resulting in a ceramic multi-layered wiring substrate.

19 Claims, 16 Drawing Sheets

METHOD OF FABRICATING A MULTI-LAYER WIRING SUBSTRATE

BACKGROUND OF THE INVENTION

The present invention relates to a method of fabricating a ceramic multi-layered wiring substrate.

An example of a conventional method of fabricating a ceramic multi-layered wiring substrate is described in "NEC Research and Development", vol. 34, No. 3, July, 1993, pp 303 to 313. According to FIG. 5 shown on page 306 of the above article, a ceramic multi-layered wiring substrate is fabricated by the following steps:

In the first step, a ceramic green sheet (referred to as a "green sheet", hereinafter) is formed by casting ceramic slurry on a carrier film and drying it.

In the second step, the green sheet is cut into a plurality of small green sheets having a desired size and each small green sheet is peeled off from the carrier film.

In the third step, through-holes are formed in each small green sheet and then buried with electrically conductive paste.

In the fourth step, a conductive layer is formed on the entire surface of each small green sheet.

In the fifth step, a plurality of such small green sheets are laminated under pressure while heating.

In the sixth step, the lamination is sintered, resulting in the multi-layered wiring substrate.

When the ceramic multi-layered wiring substrate is fabricated by the above-mentioned conventional method, the formation of through-holes is problematic for the following reasons.

As mentioned above, the small green sheet is peeled off from the carrier film in the second step and is handled in the third to fifth steps as it is.

Since the green sheet peeled off from the carrier film sheet is easily deformed, it may be deformed in the processing of the third to fifth steps mentioned above.

Particularly, deformation tends to occur in the step of burying the through-holes of the green sheet with the electrically conductive paste and in the step of printing a conductor pattern on the green sheet. Further, such deformation may occur when the green sheets are stacked in an unsuitable environment.

When any one or ones of the small green sheets are once deformed, positions of the through-holes of the green sheets cannot be aligned when they are laminated. If a degree of misalignment is considerable, there may be discontinuity of the through-holes.

SUMMARY OF THE INVENTION

In view of the foregoing, an object of the present invention is to provide a method of fabricating a multi-layered wiring substrate, which reduces the probability of discontinuity of through-holes.

In order to achieve the above object, one feature of the present invention resides in the ceramic green sheets being reinforced by carrier film sheets or thick plates to prevent deformation of the ceramic green sheets.

More specifically, according to the present invention, a ceramic green sheet is formed on a carrier film. The ceramic green sheet united with the carrier film is attached to a thick plate. After the ceramic green sheet is attached, the carrier film is removed from the ceramic green sheet. The ceramic green sheet is attached to another ceramic green sheet and the thick plate is removed. A laminated body is formed by sequentially laminating the ceramic green sheet. The laminated body is sintered. Thus, a multi-layer wiring substrate is obtained.

Throughout the process, the ceramic green sheet adheres to and is reinforced by the carrier film or the thick plate. Therefore, deformation of the ceramic green sheet is prevented. Thus, the aforementioned object is achieved.

Another feature of the present invention resides in using the carrier film as a mask when through holes are provided in the ceramic substrate. More specifically, the through holes penetrate the carrier film as well as the ceramic green sheet. The through holes are buried with electrically conductive paste. In this step, the carrier film can be used as a mask because it will be removed later.

Another feature of the present invention resides in the same binder as that mixed in the ceramic green sheet substrate being used as an adhesive when the ceramic green sheet is attached to the thick plate and when the ceramic green sheet is attached to another ceramic green sheet. This structure is preferable because the binder does not react with the ceramic green sheet.

Another feature of the present invention is that the adhesion of the adhesive is controlled by sprinkling powder over the thick plate.

Another feature of the present invention is that air is supplied between the ceramic green sheet and the thick plate when the thick plate is removed from the ceramic green sheet.

BRIEF DESCRIPTION OF THE DRAWINGS

Other objects, features and advantages of the present invention will become more apparent when the following description is read in conjunction with the accompanying drawings, wherein.

In these figures, the same reference numerals depict the same parts, respectively.

DESCRIPTION OF THE PREFERRED EMBODIMENT

An embodiment of the present invention will be described with reference to the accompanying drawings. In this embodiment, a ceramic multi-layered wiring substrate including five ceramic sheets is fabricated.

Figure 1:
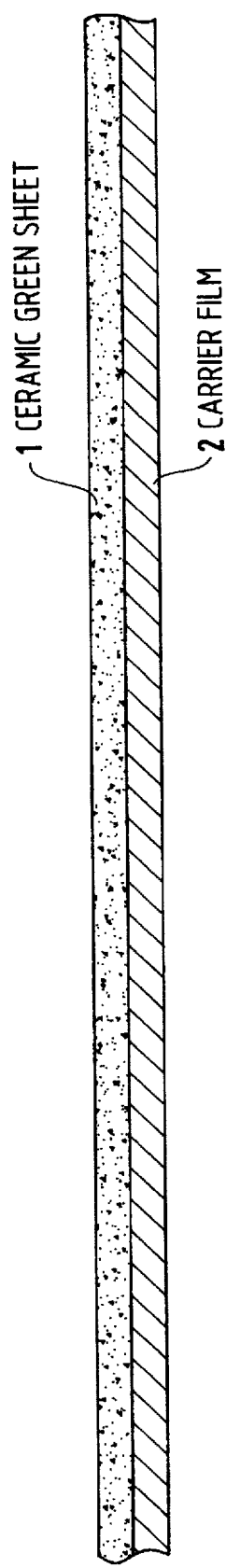
FIG. 1 shows the first step of a first embodiment of the present invention.
Figure 2A:
FIGS. 2A–2E shows the second step of the first embodiment of the present invention.
Figure 2B:
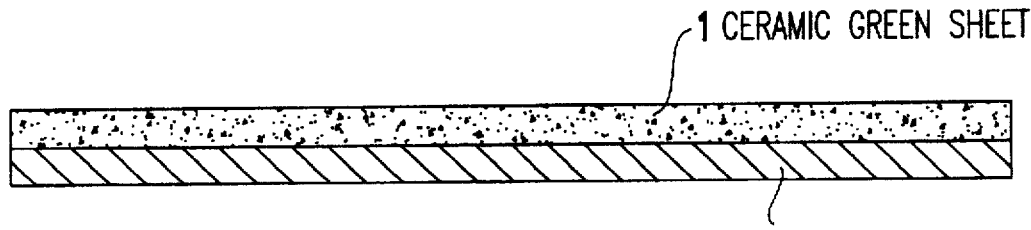
Figure 2C:
Figure 2D:
Figure 2E:
Figure 3A:
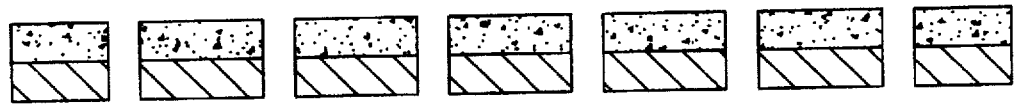
FIGS. 3A–3E shows the third step of the first embodiment of the present invention.
Figure 3B:
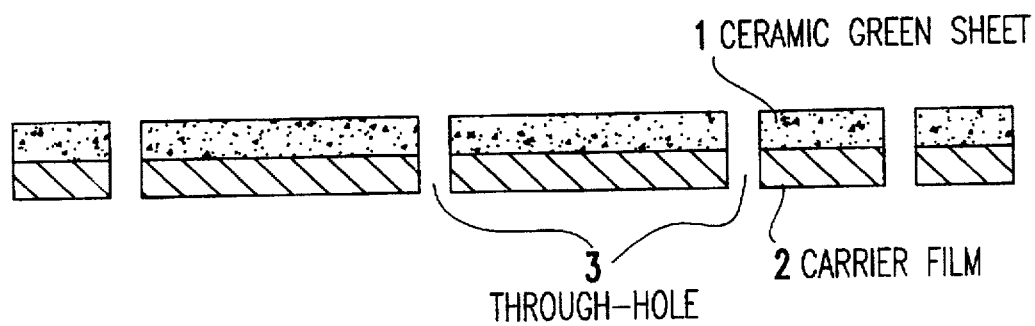
Figure 3C:
Figure 3D:
Figure 3E:
Figure 4A:
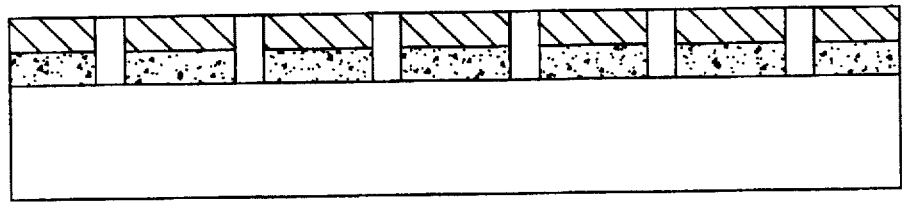
FIGS. 4A–4E shows the fourth step of the first embodiment of the present invention.
Figure 4B:
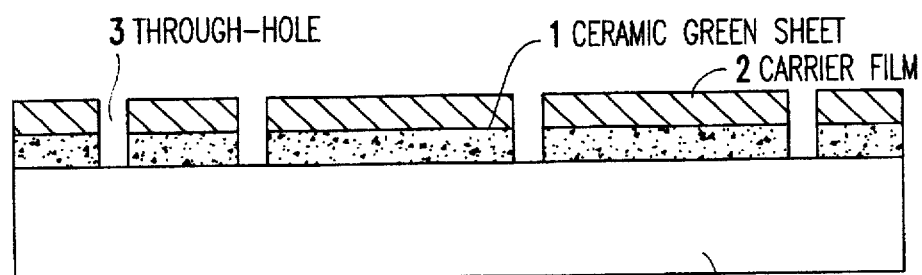
Figure 4C:
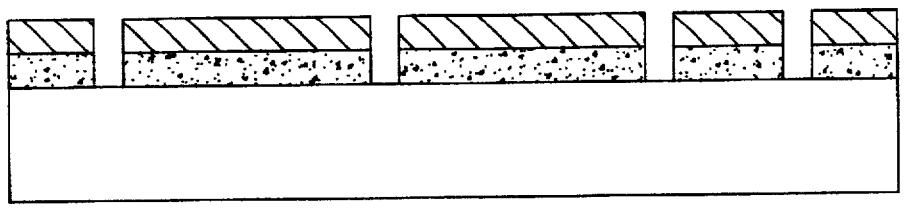
Figure 4D:
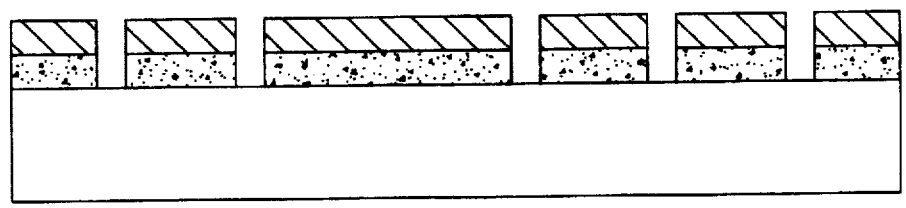
Figure 4E:
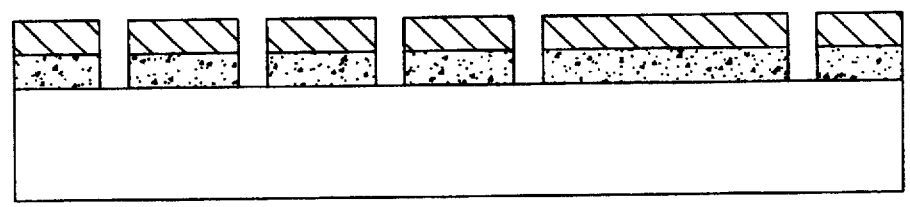

Referring to FIG. 1 which shows the first step of the present method, a ceramic green sheet 1 (referred to as merely a "green sheet", hereinafter) is formed on a carrier film 2 by a doctor blade process. The thickness of the green sheet 1 is in a range from 50 μm to 400 μm and its specific thickness depends upon the structure, electrical characteristics and mechanical characteristics of a ceramic multi-layered wiring substrate 15 which will be a final product of the process. In this embodiment, the thickness of the green sheet 1 is approximately 100 μm.

The carrier film should be made of materials with low moisture absorbency. An example of preferable materials is polyphenylene sulfide (PPS).

The thickness of the carrier film 2 is 100 μm. Generally, the thickness of the carrier film 2 is within a range of from 80% to 100% of the thickness of the green sheet 1. However, the thickness should be changed correspondingly to a width of the green sheet 1.

After the first step, the carrier film 2 having the green sheet 1 thereon is rolled up. In this case, if the carrier film 2 is too thin, it may undulate, so that the thickness of the green sheet 1 may vary. This phenomenon becomes noticeable when the width of the green sheet 1 is large. For example, a thickness of 75% of the thickness of the green sheet 1 is permissible when the width of the carrier sheet 2 is 150 mm. However, it is not permissible when the width is 400 mm. When the width of the green sheet 1 is 300 mm or wider, special precautions are necessary.

Referring to FIGS. 2(a) to 2(e) which show the second step of the present method, the green sheet 1 united with the carrier film 2 is cut to a plurality of pieces of the green sheet 1 which have a predetermined size. The green sheet 1 and the carrier film 2 are preferably cut with a cutter. These green sheets 1 become a first to fifth layers of the final ceramic multi-layered wiring substrate 15.

Then, in the third step shown in FIGS. 3(a) to 3(e), through-holes 3 are formed in each of the green sheets 1 united with the carrier films 2 which are shown in FIGS. 2(a) to 2(e), respectively. The through-holes 3 may be formed by punching or the like.

The size of the through-holes 3 depends upon their intended use. For the through-holes 3 for signal wiring, their diameters may be in a range of from 50 μm to 200 μm and, for the through-holes 3 for a power source, the diameters may be in the range of from 200 μm to 400 μm.

In the third step of the process, deformation of the green sheets 1 is prevented since they are reinforced by the carrier film sheets 2.

In the fourth step as shown in FIGS. 4(a) to 4(e), the green sheets 1 shown in FIGS. 3(a) to 3(e) are attached to thick plates 4, respectively.

The thick plate 4 may comprise a rigid material which is any of metal, glass and plastics so long as its water absorptivity is low and its variation in size is small. The thickness of the thick plate 4 may be on the order of 0.5 mm to 10 mm.

The attachment of the green sheet 1 to the thick plate 4 is performed by using an adhesive which has a suitable adhesion and does not react with the green sheet 1. It is preferable to use an adhesive whose adhesion property is large enough to hold the green sheet 1 on the thick plate 4 and yet to allow the green sheet 1 to be easily peeled off therefrom. Further, the adhesion thereof is preferably controlled.

An example of a suitable material for the adhesive is the material mixed into the slurry as a binder because it does not react with the green sheet 1. The adhesion property of this adhesive can be controlled by sprinkling a powder such as alumina or silica over the thick plate 4.

Attaching the green sheet 1 to the thick plate 4 should be performed carefully so that there is no void in the areas of the green sheet 1 around the through-holes 3 thereof.

In the fourth step of the process, deformation of the green sheets 1 is prevented since they are still reinforced by the carrier film sheets 2.

In the fifth step as shown in FIGS. 5(a) to 5(e) which correspond to FIGS. 4(a) to 4(e), respectively, the through-holes 3 of the green sheets 1 are buried with electrically conductive paste 6.

Figure 5A:
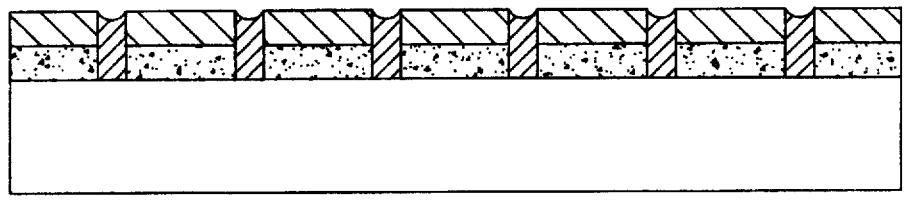
FIGS. 5A–5E shows the fifth step of the first embodiment of the present invention.
Figure 5B:
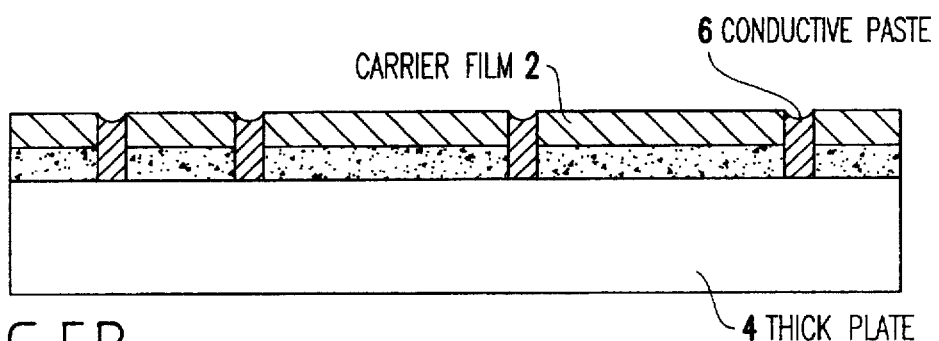
Figure 5C:
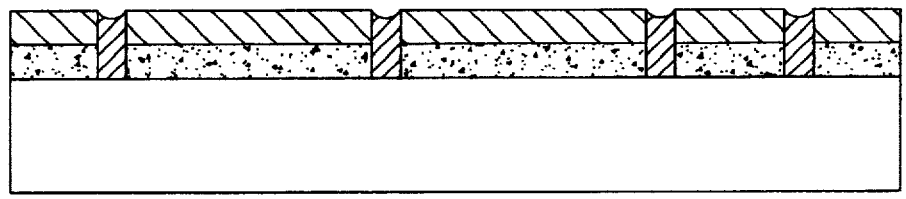
Figure 5D:
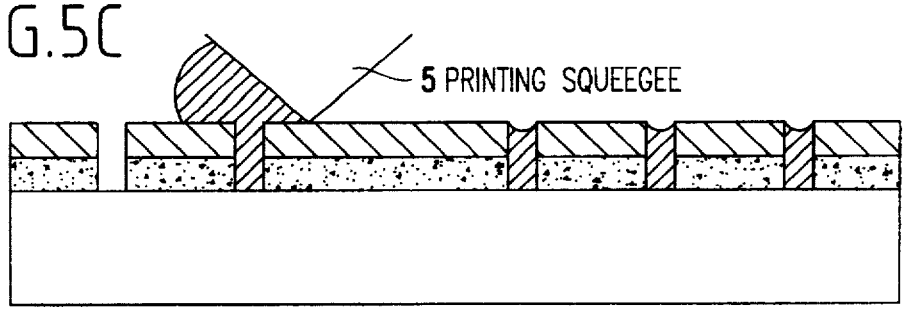
Figure 5E:
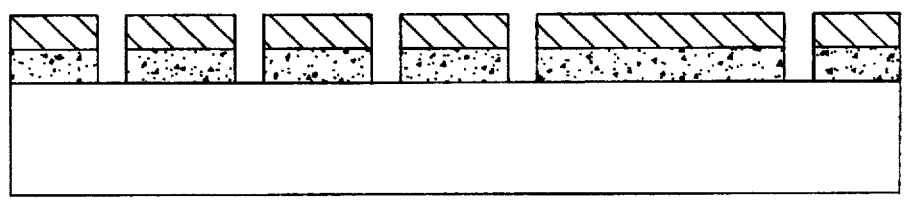
Figure 6A:
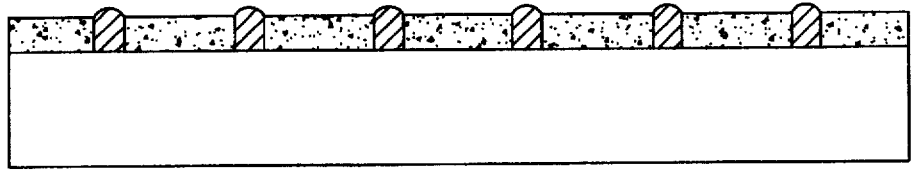
FIGS. 6A–6E shows the sixth step of the first embodiment of the present invention.
Figure 6B:
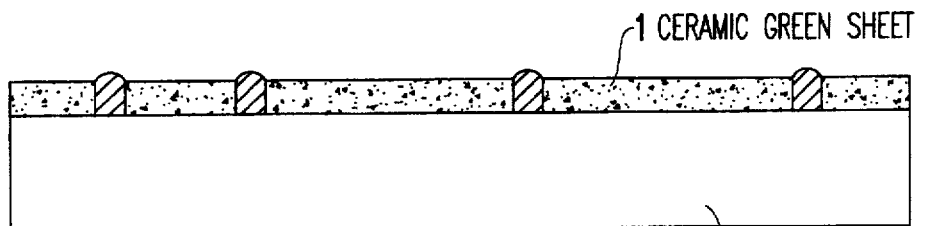
Figure 6C:
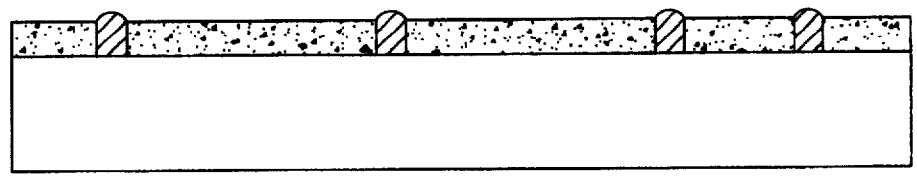
Figure 6D:
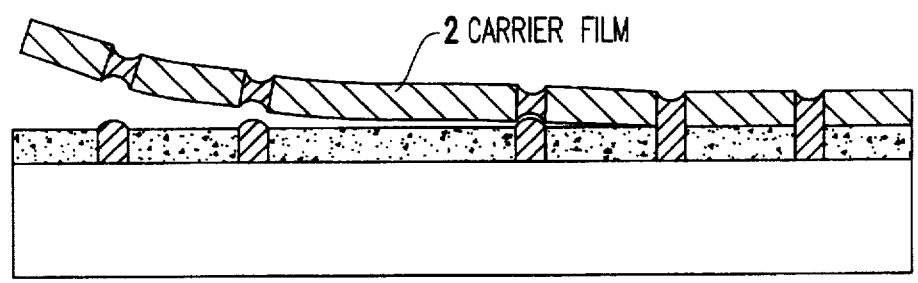
Figure 6E:
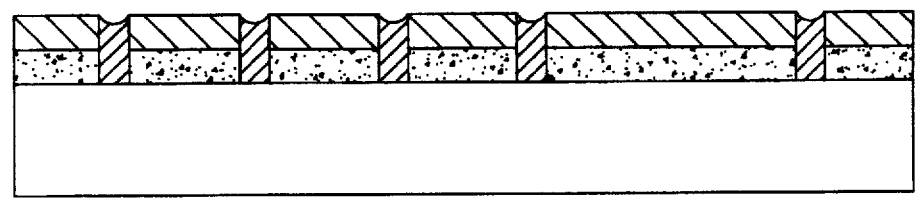

Referring to FIG. 5(d), the conductive paste 6 is stuffed into the through-holes 3 with a printing "squeegee" (e.g., roller or the like) 5 moving across the surface of the carrier film 2.

In the fifth step, the carrier films 2 serve as masks. Therefore, there is no need of using special masks such as metal masks which are necessary in the conventional structure.

The material of the electrically conductive paste 6 is preferably selected from a group consisting of at least one of gold, silver, silver-palladium, copper, tungsten and molybdenum, etc. Viscosity of the conductive paste 6 is preferably on the order of 300 kcps to 500 kcps.

In a step of the conventional method corresponding to the fifth step of the present invention, the special metal mask is directly formed by using a design data and, therefore, the position of the through-holes formed by using such metal mask is precise. If the position of the through-holes is not precise, the through-holes are not buried with the conductive paste in the conventional structure. Therefore, it is possible in the prior art method to easily know any deviation of position of the through-hole.

In the fifth step of the present invention, however, it is necessary to check the position of the through-hole carefully with a machine since, in the fourth step of the present invention, no metal mask is used and thus it is difficult to know positional deviation of the through-hole 3.

In the fifth step of the process, deformation of the green sheets 1 is prevented since they are still reinforced by the thick plate 4.

In the sixth step as shown in FIGS. 6(a) to 6(e) which correspond to FIGS. 5(a) to 5(e), respectively, the carrier films 2 are peeled off from the green sheets 1.

Then, in the seventh step as shown in FIGS. 7(a) to 7(e) which correspond to FIGS. 6(a) to 6(e), respectively, conductive patterns 7 are formed on the respective green sheets 1.

The conductive pattern 7 may be formed by screen printing or the like. The material of an electrically conductive paste forming the conductive pattern 7 may be the same as the conductive paste 6 used to bury the through-holes 3, except that its viscosity is preferably 100 kcp to 250 kcp. The mesh size of a screen used in forming the conductive pattern is preferably 523 mesh. The width of the wiring line of the conductive patter 7 thus formed is preferably 100 μm at the minimum. The thickness of the conductive pattern 7 after dried is preferably 12 μm.

In the seventh step of the process, deformation of the green sheets 1 is prevented since they are still reinforced by the thick plate.

The green sheets 1 forming the respective layers of the ceramic multi-layered wiring substrate 15 are prepared by performing the first to seventh steps mentioned above. The succeeding steps are to laminate and suitably connect these green sheets 1 by using a laminating metal die 9 and an upper punch 10.

Figure 8:
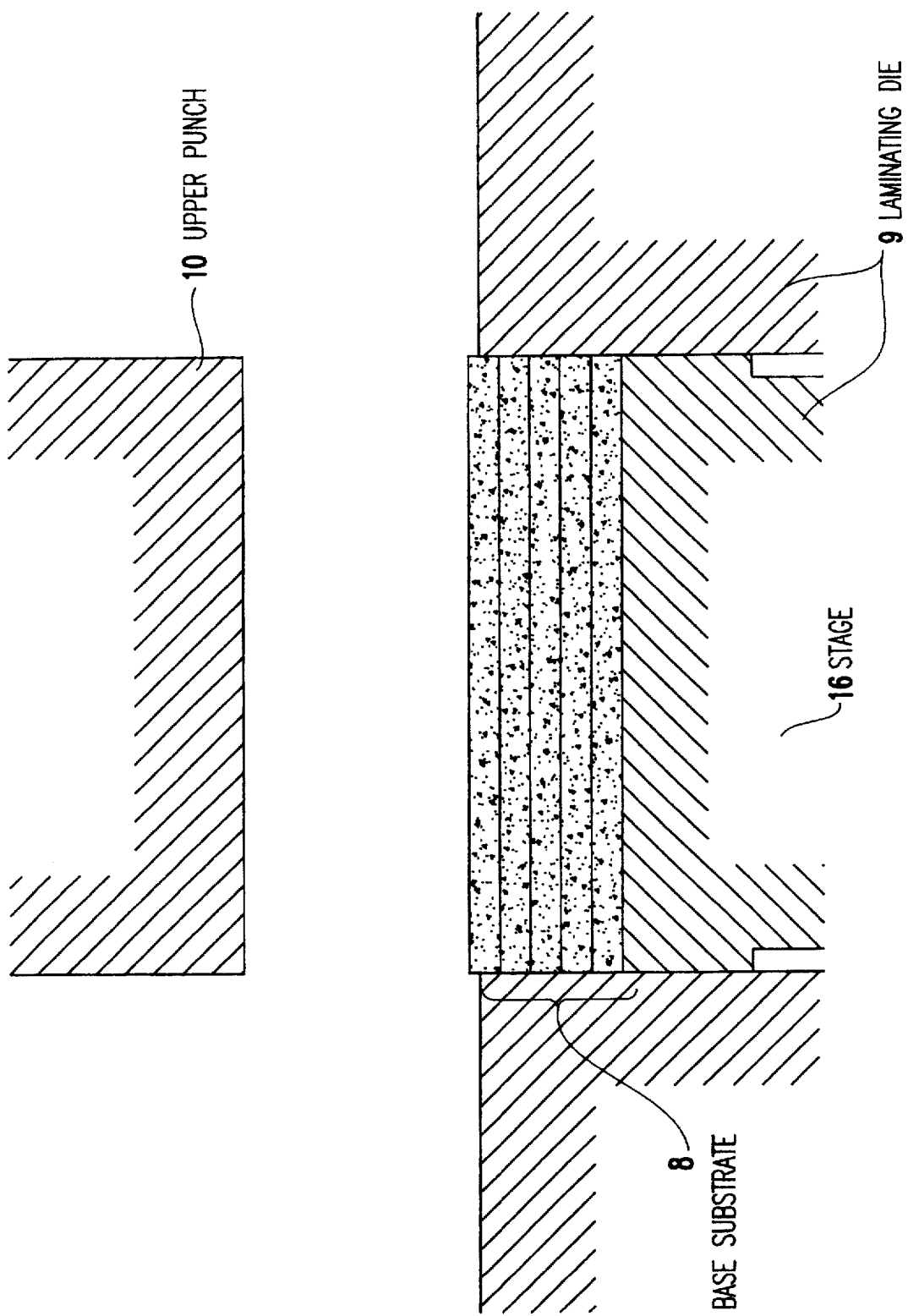
FIG. 8 shows the eighth step of the first embodiment of the present invention.

Referring to FIG. 8 which shows the eighth step, a stage 16 which is movable vertically is arranged in a center hole of the laminating metal die 9. The stage 16 is supported by springs and is movable elastically. The stage 16 moves down according to the number of the green sheets stacked thereon and the height of the uppermost green sheet approximately meets that of the upper surface of the laminating die 9.

In the eighth step of the process, base plates 8 which are ceramic green sheets having no through-holes are stacked on the stage 16.

These base plates 8 are loosely fixed on the stage 16 by means of vacuum absorption utilizing holes formed in an edge portion of an upper surface of the stage 16. Alternatively, the base plates 8 may be loosely adhered to the upper surface of the stage 16.

Figure 9:
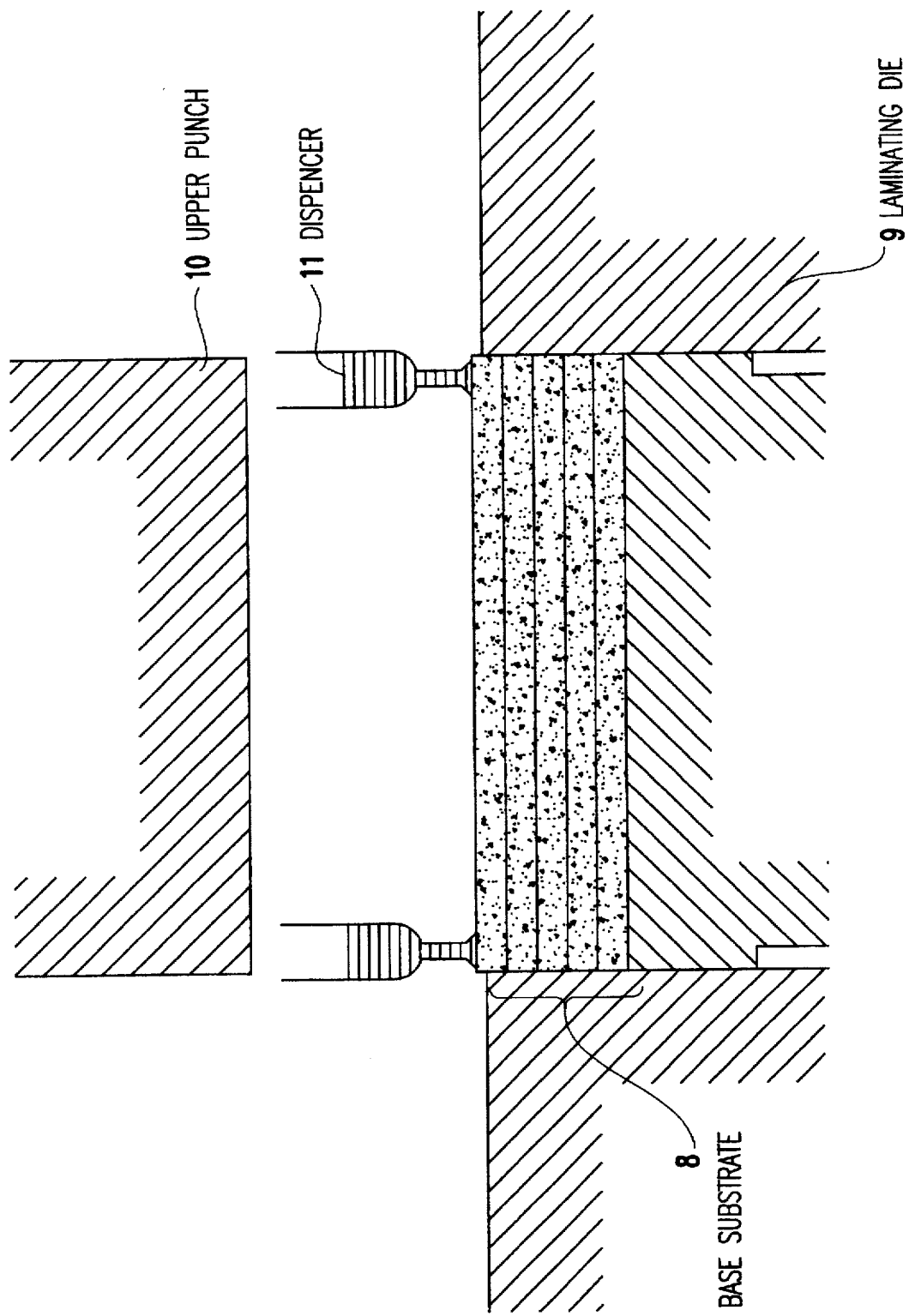
FIG. 9 shows the ninth step of the first embodiment of the present invention.

In the ninth step as shown in FIG. 9, a peripheral portion of the uppermost base plate 8 has applied thereto an organic solvent or adhesive which is used as a binder for adhering the ceramic green sheet 1, by means of dispensers 11. A preferred solvent is, for example, alcohol or polyphenylene sulfide. A preferred adhesive is, for example, polyvinyl alcohol.

The organic solvent or adhesive may be applied thereto by spraying. Alternatively, a portion of a surface of the green sheet 1 may be coated with the organic solvent or adhesive.

Figure 7A:
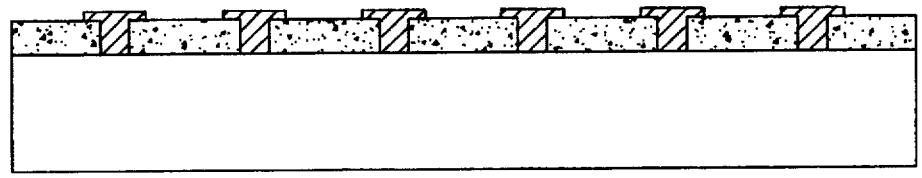
FIGS. 7A–7E shows the seventh step of the first embodiment of the present invention.
Figure 7B:
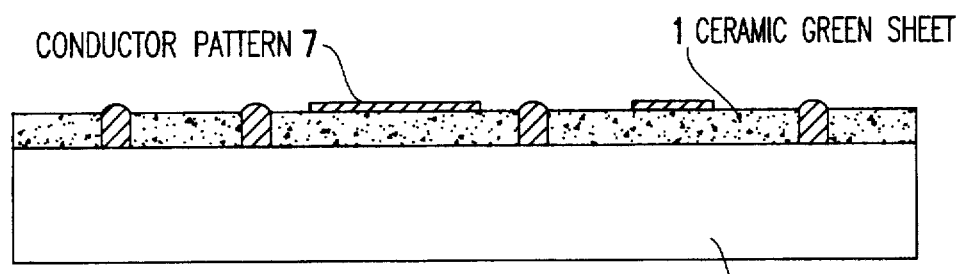
Figure 7C:
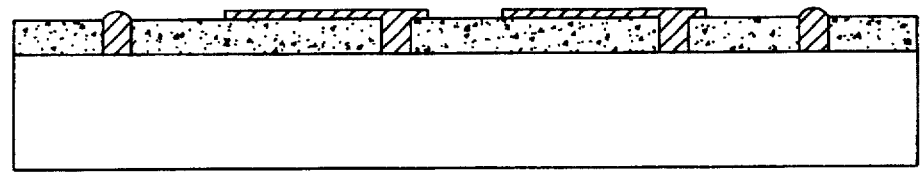
Figure 7D:
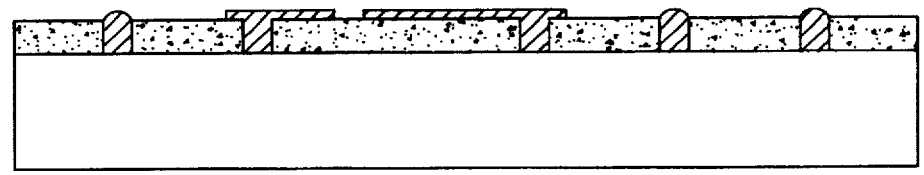
Figure 7E:
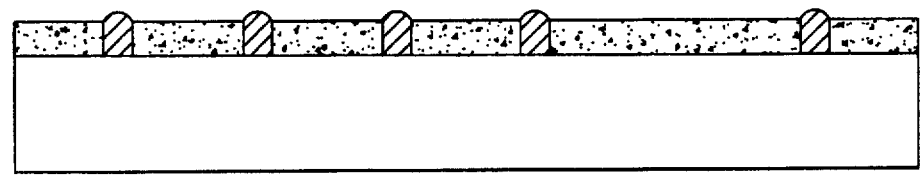
Figure 10:
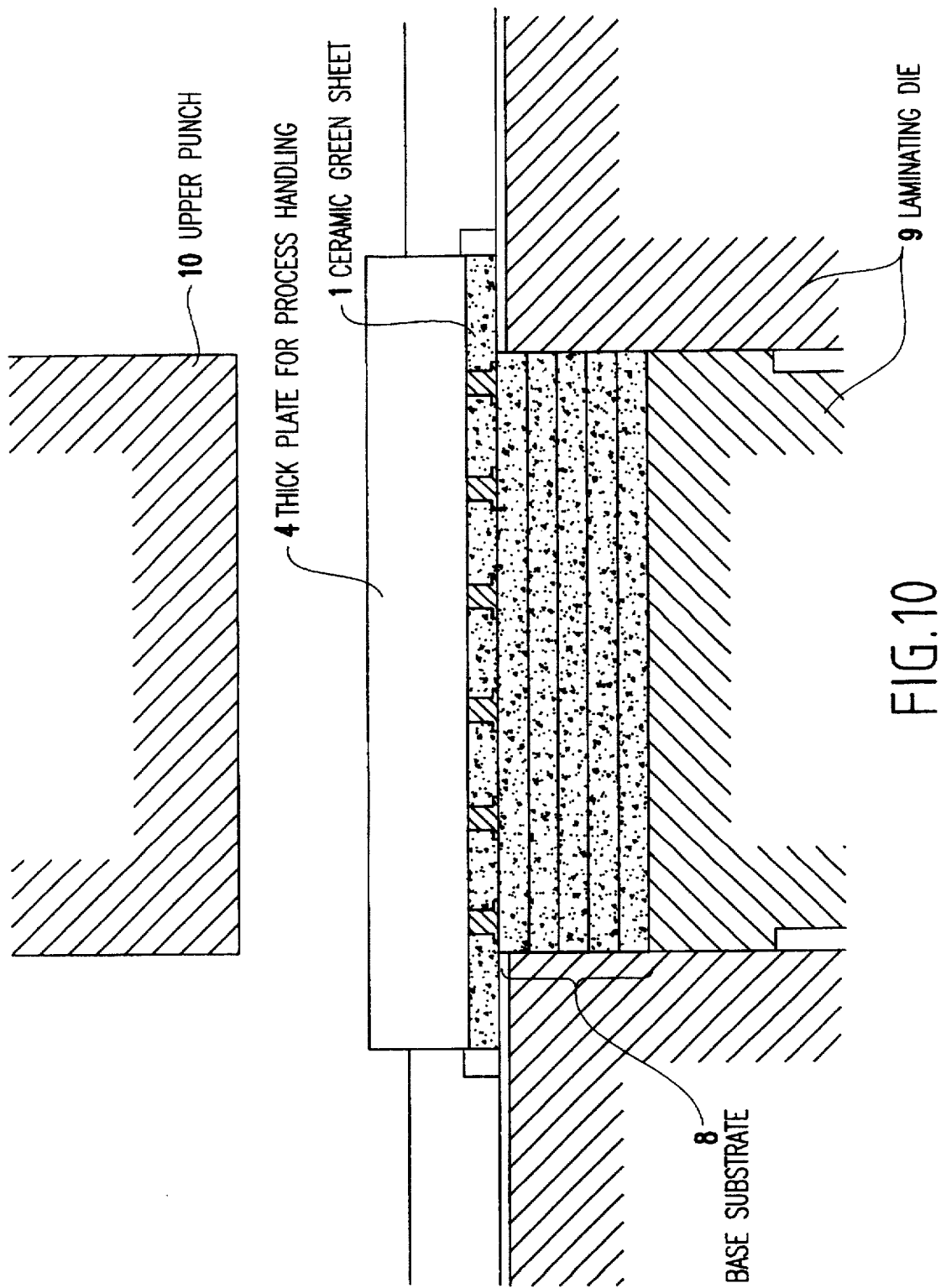
FIG. 10 shows the tenth step of the first embodiment of the present invention.

In the tenth step as shown in FIG. 10, the green sheet 1 shown in FIG. 7(a) is put on the uppermost base plate 8 after a positioning operation.

In the tenth step of the process, deformation of the green sheets 1 is prevented since they are still reinforced by the thick plate 4.

Figure 11:
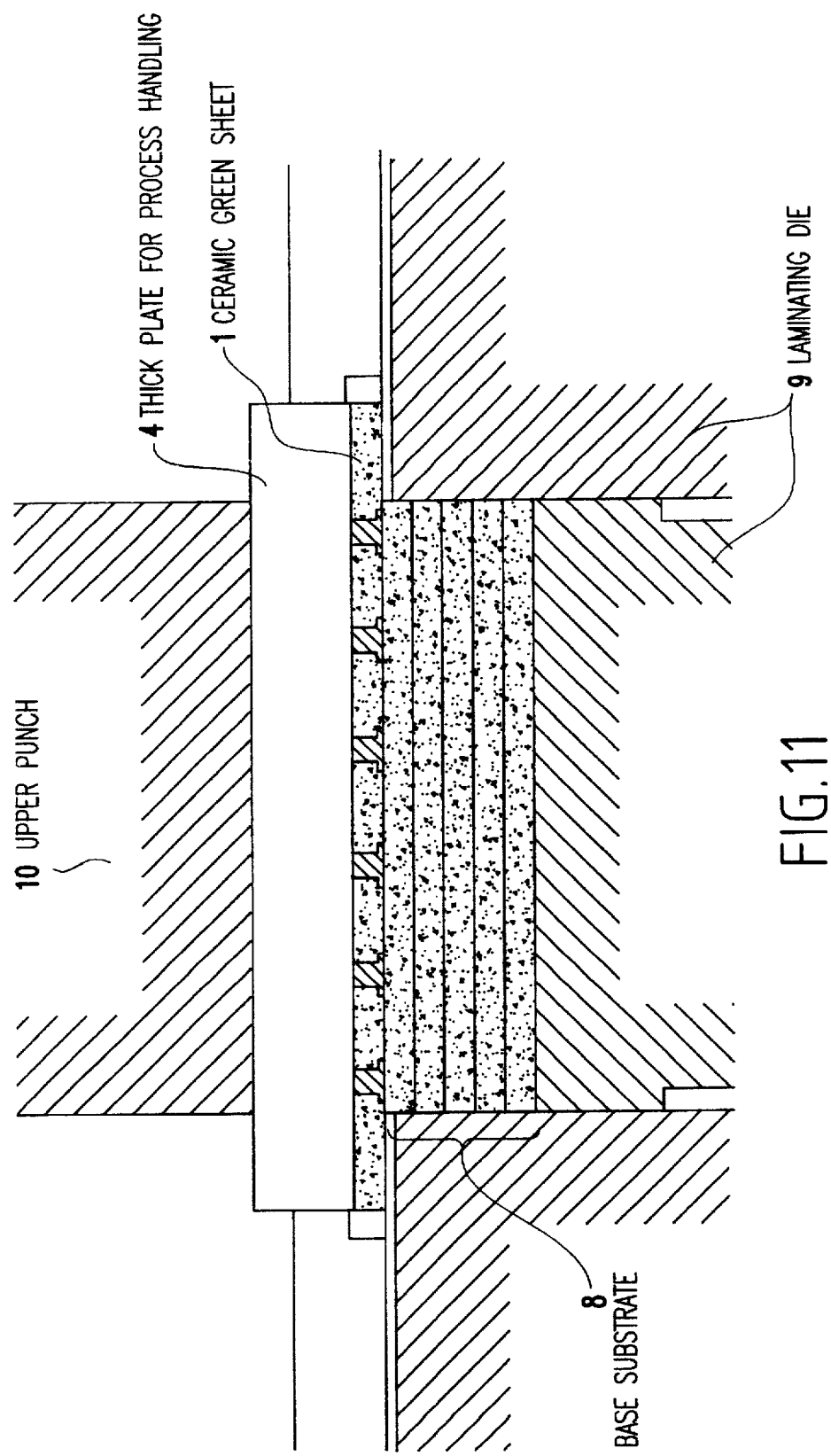
FIG. 11 shows the eleventh step of the first embodiment of the present invention.

In the eleventh step as shown in FIG. 11, the green sheet 1 is pushed down onto the uppermost base plate 8 by lowering the upper punch 10, so that the green sheet 1 is fixed to the base plate 8 and, thus, positional deviation is prevented.

In the eleventh step of the process, deformation of the green sheets 1 is prevented since they are still reinforced by the thick plate 4.

Figure 12:
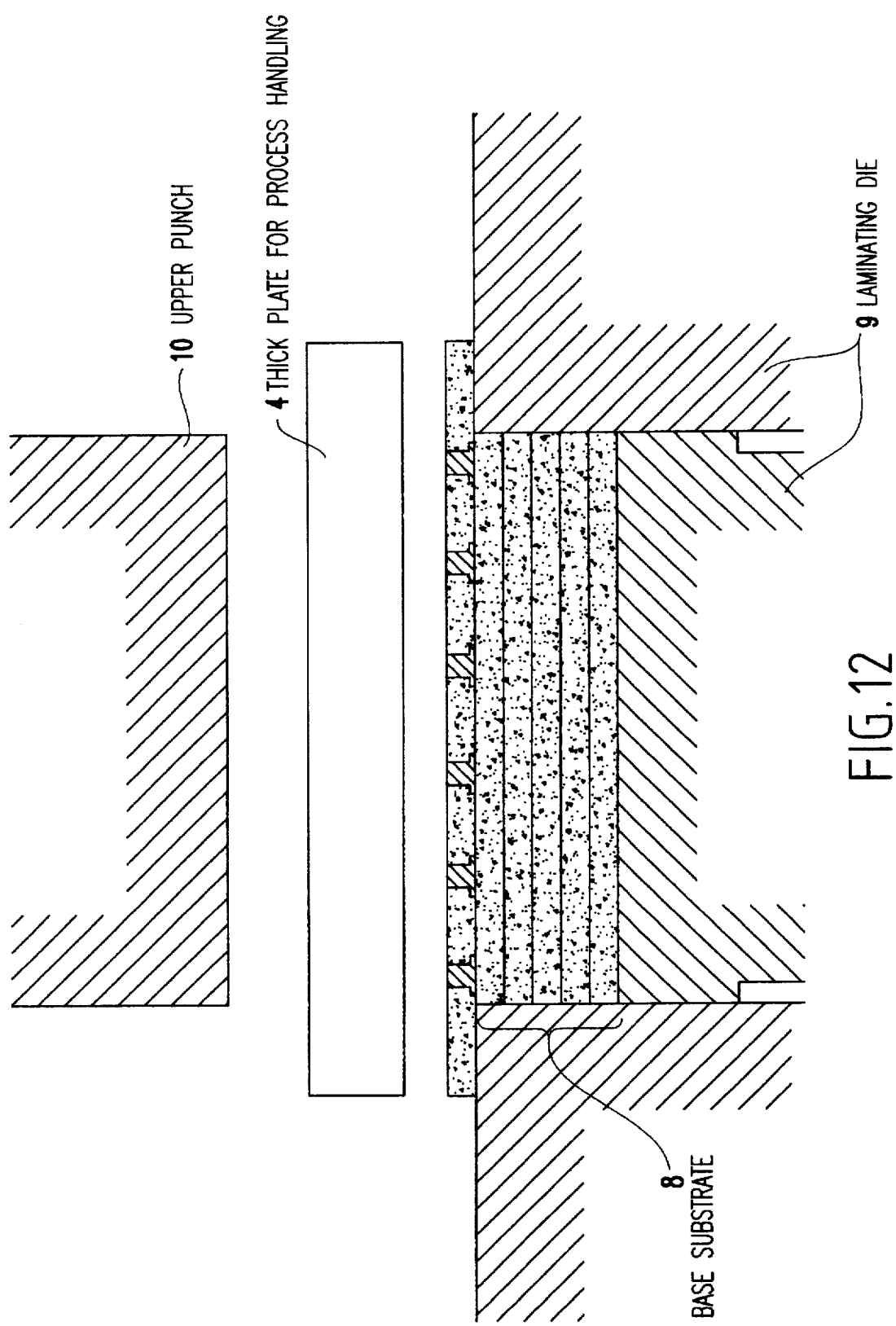
FIG. 12 shows the twelfth step of the first embodiment of the present invention.

In the twelfth step as shown in FIG. 12, the thick plate 4 is removed from the green sheet 1. In this case, the thick plate 4 should preferably be removed from the green sheet 1 while minimizing deformation of the latter. The restriction of deformation of the green sheet 1 may preferably be performed by supplying air between the green sheet 1 and the thick plate 4. More specifically, the air is supplied through holes formed in the thick plate 4. The supplied air spreads into the gap between the green sheet 1 and the thick plate 4 so that the green sheet 1 separates therefrom and peels off.

In the twelfth step of the process, deformation of the green sheet 1 is minimized since it is fixed to the base plates 8.

Figure 13:
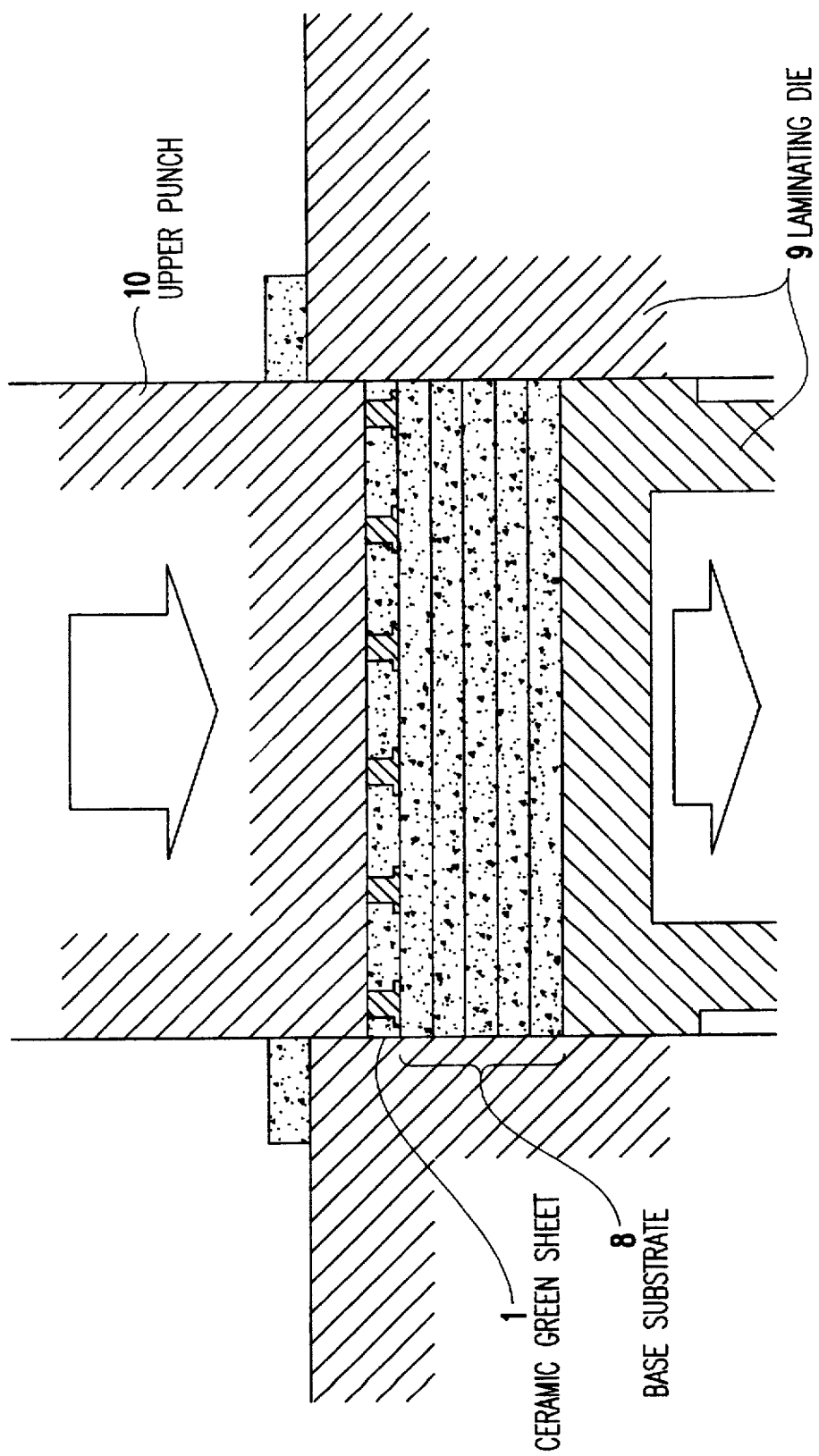
FIG. 13 shows the thirteenth step of the first embodiment of the present invention.

In the thirteenth step as shown in FIG. 13, the green sheet 1 is further pushed down into the center hole of the metal die 9 by the downward movement of the upper punch 10 and a peripheral portion of the green sheet 1 is cut away by an edge of the center hole of the die 9. When the upper punch 10 pushes against 110 the green sheet 1, the stage 16 moves down by the elasticity of the springs. Therefore, the green sheets do not buckle.

Figure 14:
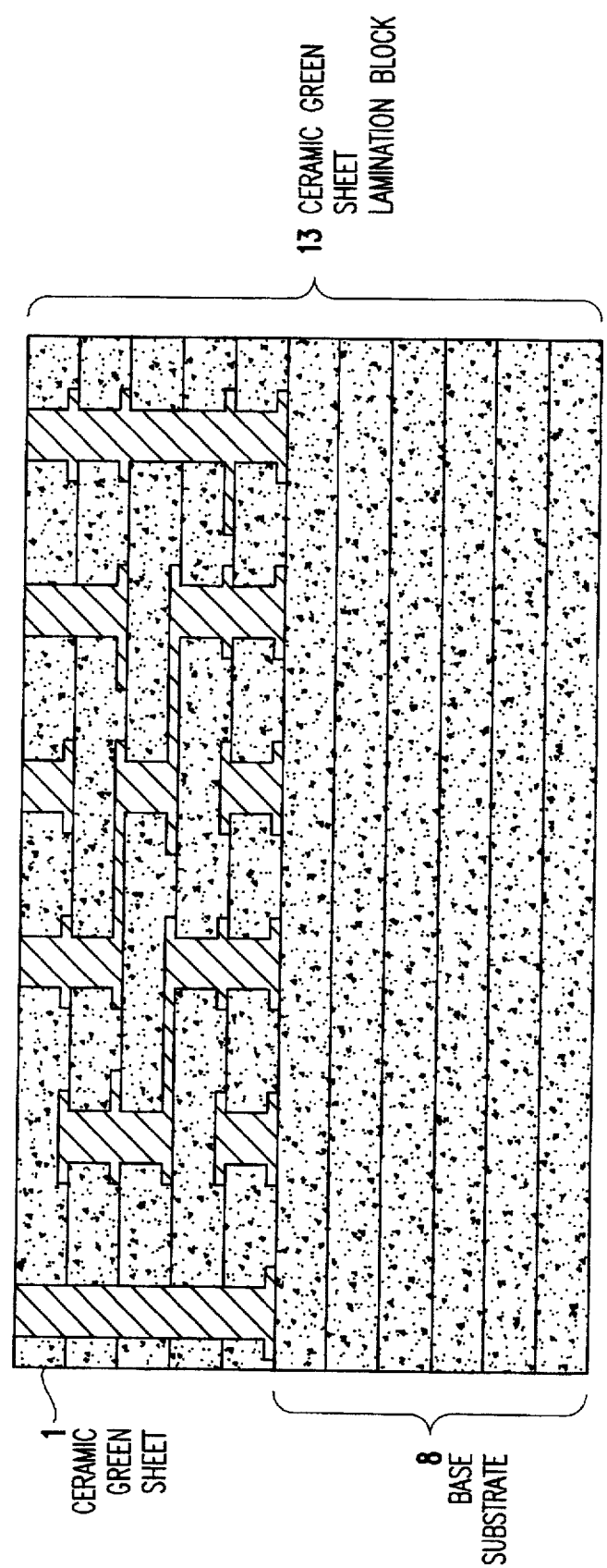
FIG. 14 shows the fourteenth step of the first embodiment of the present invention.

In the thirteenth step of the process, deformation of the green sheet 1 is minimized since it is fixed to the base plates In the fourteenth step as shown in FIG. 14, the ninth to thirteenth steps of the process are repeated to sequentially laminate the green sheets 1 shown in FIGS. 7(b) to 7(e). Then, the laminated green sheets 1 on the base plates 8 are heated under pressure resulting in a ceramic green sheet lamination block 13. The heat-pressing is preferably performed under conditions of temperature of approximately 110° C. and pressure of 180 kg/cm².

As mentioned, deformation of the green sheet 1 is minimized in the respective second to thirteenth steps. Therefore, positional deviation of the through-holes 3 in the green sheets 1 laminated in the fourteenth step is minimized and the through-holes 3 of the respective green sheets 1 of the ceramic green sheet lamination block 13 are precisely aligned. That is, the probability of a connection failure of the through-holes 3 is minimized.

Figure 15:
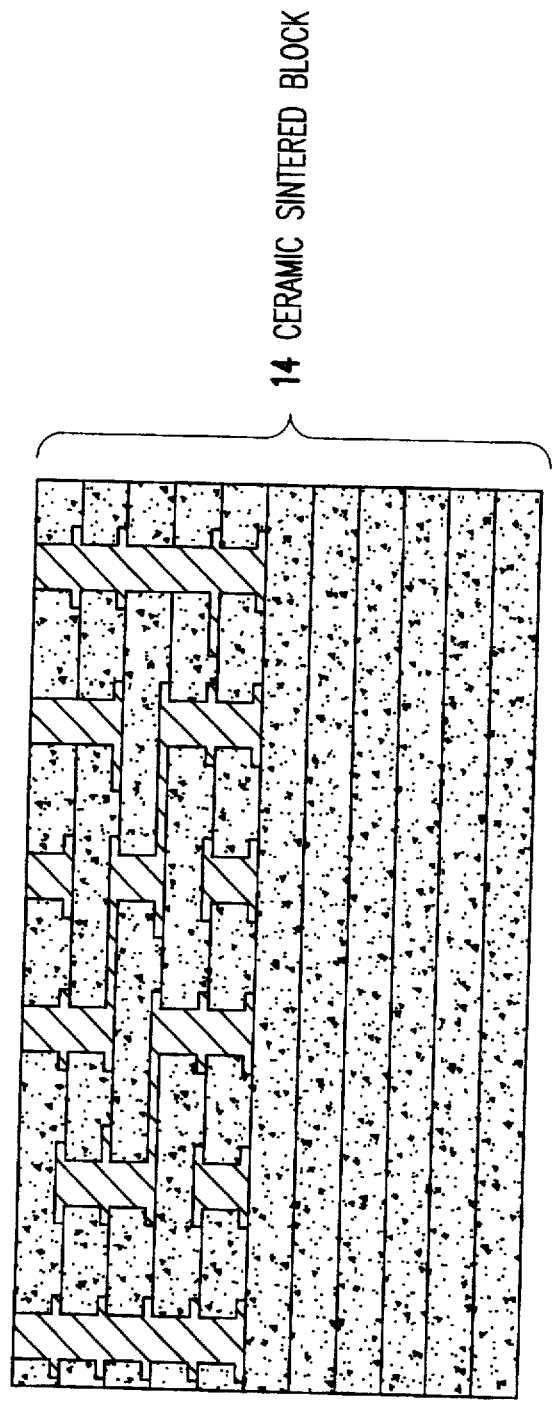
FIG. 15 shows the fifteenth step of the first embodiment of the present invention.

In the fifteenth step as shown in FIG. 15, the ceramic green sheet lamination block 13 is sintered. Preferred sintering conditions are described in pp. 305–307 of the aforementioned article.

The binders between adjacent ones of the green sheets 1 are removed by the sintering process, thereby resulting in a ceramic green sheet sintered block 14. The volume of the ceramic green sheet sintered block 14 is reduced by approximately 10 to 15% compared with the ceramic green sheet lamination block 13, by the sintering operation.

Figure 16:
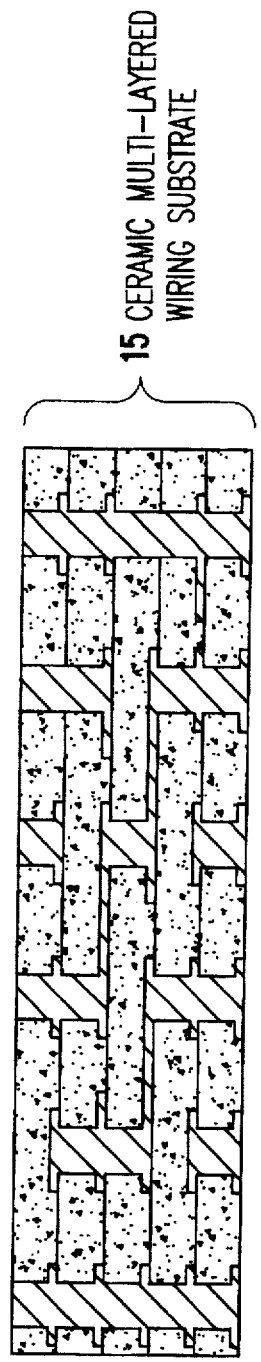
FIG. 16 shows the sixteenth step of the first embodiment of the present invention.

In the sixteenth step as shown in FIG. 16, the base plates 8 are removed from the ceramic green sheet sintered block 14 by grinding or the like, so that the through-holes 3 are exposed, resulting in the ceramic multi-layered wiring substrate 15.

Although, in the described embodiment, the green sheet 1 has applied thereto the organic solvent or adhesive in the ninth step as the binder, an adhesive sheet may be used instead of applying or painting the green sheet, so long as the material of such an adhesive sheet is removed by the sintering process in the fourteenth step.

As described hereinbefore, in the fabrication method of the ceramic multi-layered wiring substrate according to the present invention, the green sheet 1 is processed while being reinforced by the carrier film 2 and the thick plate 4. Therefore, deformation of the green sheet 1 in the respective fabrication steps is minimized. For example, although the positional deviation of the through-holes according to the conventional method is approximately 60 μm, it can be reduced to about 20 μm according to the method of the present invention.

Due to such reduction of the positional deviation of the through-holes, the probability of connection failure of the through-holes can be reduced. That is, the reliability of the ceramic multi-layered wiring substrate is much improved. Additionally, through-holes may be formed having a diameter much smaller than that obtainable by the conventional method. Specifically, the lower limit of the diameter of through-holes is reduced from 200 μm to approximately 110 μm by the present invention when the substrate size is 250 mm$^2$.

Thus, the mounting density on the ceramic multi-layered wiring substrate can be improved. These advantages can be realized even when the mechanical strength of the green sheet 1 is lowered due to a reduced thickness thereof or change of material thereof.

Another advantage of the present fabrication method is that metal masks are not required in the step of forming the through-holes 3 as in the conventional method.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of fabricating a multi-layer wiring substrate, comprising steps of:
    (a) forming a green sheet on a carrier film;
    (b) attaching said green sheet united with said carrier film to a rigid plate;
    (c) removing said carrier film from said green sheet;
    (d) attaching said green sheet united with said rigid plate to another green sheet and removing said rigid plate thereby forming a body of green sheets;
    (e) laminating said body of green sheets to form a laminated body of green sheets; and
    (f) sintering said laminated body,
    wherein said attaching step (b) includes a step of attaching said green sheet to said rigid plate with a first adhesive.

2. A method as claimed in claim 1, wherein said green sheet is continually supported by at least one of said carrier film and said rigid plate during said steps (a)–(d).

3. A method as claimed in claim 1, wherein said forming step (a) includes a step of forming said green sheet on said carrier film by casting ceramic slurry over said carrier film.

4. A method as claimed in claim 1, wherein said attaching step (b) includes steps of:
    forming through holes in said green sheet, said through holes penetrating said carrier film; and
    filling said through holes with electrically conductive paste, said carrier film operating as a mask.

5. A method as claimed in claim 1, wherein said attaching step (d) includes a step of supplying air between said green sheet and said rigid plate.

6. A method as claimed in claim 1, wherein said laminating step (e) includes a step of forming said laminated body on a base plate; and
    wherein said sintering step (f) includes a step of removing said base plate.

7. A method as claimed in claim 1, wherein said attaching step (d) includes a step of attaching said green sheet to said another green sheet with a second adhesive.

8. A method as claimed in claim 7, wherein said green sheet includes a binder, and wherein said second adhesive is a member of the group consisting of polyvinyl alcohol and a same binder as that of said green sheet.

9. A method as claimed in claim 1, wherein said attaching step (d) includes a step of attaching said green sheet to said another green sheet with a solvent.

10. A method as claimed in claim 9, wherein said solvent is a member of the group consisting of alcohol and polyphenylene sulfide.

11. A method as in claim 1, wherein said rigid plate comprises any of metal, glass and plastic.

12. A method as in claim 1, wherein said rigid plate has a thickness greater than that of said green sheet united with said carrier.

13. A method as in claim 1, wherein said removing in said attaching step (d) includes forcing air through holes in said rigid plate to remove said rigid plate from said green sheet.

14. A method of fabricating a multi-layer wiring substrate, comprising steps of:
    (a) forming a green sheet on a carrier film;
    (b) attaching said green sheet united with said carrier film to a plate;
    (c) removing said carrier film from said green sheet;
    (d) attaching said green sheet united with said plate to another green sheet and removing said plate thereby forming a body of green sheets;
    (e) laminating said body of green sheets to form a laminated body of green sheets; and
    (f) sintering said laminated body,
    wherein said green sheet is attached to said plate by a first adhesive, and
    said method further comprising a step of sprinkling powder over said plate for controlling an adhesion of said first adhesive.

15. A method as claimed in claim 14, wherein said powder is a member of the group consisting of alumina and silica.

16. A method of fabricating a multi-layer wiring substrate, comprising steps of:
    (a) forming a green sheet on a carrier film;
    (b) attaching said green sheet united with said carrier film to a plate;
    (c) removing said carrier film from said green sheet;
    (d) attaching said green sheet united with said plate to another green sheet and removing said plate thereby forming a body of green sheets;
    (e) laminating said body of green sheets to form a laminated body of green sheets; and
    (f) sintering said laminated body,
    wherein said green sheet is attached to said plate by a first adhesive, and
    wherein said first adhesive comprises a binder, said green sheet including a same binder as that of said first adhesive.

17. A method of fabricating a multi-layer wiring substrate, comprising steps of:
    (a) forming a green sheet on a carrier film;
    (b) attaching said green sheet united with said carrier film to a rigid plate;
    (c) removing said carrier film from said green sheet;
    (d) attaching said green sheet united with said rigid plate to another green sheet and removing said rigid plate thereby forming a body of green sheets;
    (e) laminating said body of green sheets to form a laminated body of green sheets; and
    (f) sintering said laminated body,
    wherein said removing step (c) includes a step of forming a conductive layer on said green sheet.

18. A method of fabricating a multi-layer wiring substrate, comprising steps of:

9

(a) forming a green sheet on a carrier film;

(b) attaching said green sheet united with said carrier film to a rigid plate;

(c) removing said carrier film from said green sheet;

(d) attaching said green sheet united with said rigid plate to another green sheet and removing said rigid plate thereby forming a body of green sheets;

(e) laminating said body of green sheets to form a laminated body of green sheets; and (f) sintering said laminated body, wherein said attaching step (d) includes a step of cutting away a peripheral portion of said green sheet.

19. A method of fabricating a multi-layer wiring substrate, comprising steps of:

10

(a) forming a green sheet on a carrier film;

(b) attaching said green sheet united with said carrier film to plate;

(c) removing said carrier film from said green sheet;

(d) attaching said green sheet united with said plate to another green sheet and removing said plate thereby forming a body of green sheets;

(e) laminating said body of green sheets to form a laminated body of green sheets; and (f) sintering said laminated body, wherein said carrier film comprises polyphenylene sulfide.

* * * * *